(12) United States Patent
Hacker et al.

(10) Patent No.: US 8,476,679 B2
(45) Date of Patent: Jul. 2, 2013

(54) SYSTEM OF DYNAMIC AND END-USER CONFIGURABLE ELECTRICAL INTERCONNECTS

(75) Inventors: Jonathan B. Hacker, Thousand Oaks, CA (US); Christopher E. Hillman, Newbury Park, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 137 days.

(21) Appl. No.: 13/016,627

(22) Filed: Jan. 28, 2011

(65) Prior Publication Data
US 2012/0193682 A1 Aug. 2, 2012

(51) Int. Cl.
*H01L 23/52* (2006.01)
(52) U.S. Cl.
USPC ............... 257/209; 257/59; 257/72; 257/258; 257/202
(58) Field of Classification Search
USPC ............................... 257/59, 72, 258, 202, 209
See application file for complete search history.

(56) References Cited

U.S. PATENT DOCUMENTS

| | | | |
|---|---|---|---|
| 4,959,705 A | 9/1990 | Lemnios et al. | |
| 2001/0010884 A1* | 8/2001 | Guehler et al. | 430/7 |
| 2010/0123532 A1 | 5/2010 | Hillman et al. | |

OTHER PUBLICATIONS

Chen, S. et al., "A novel structural VO$_2$ micro-optical switch", *Optical and Quantum Electronics*, 35, 1351-1355 (2003).
Sovero, E. et al., "Fast Thin Film Vanadium Dioxide Microwave Switches", Gallium Arsenide Integrated Circuit (GaAs IC) Symposium 1990, Technical Digest, 101-103, 1990 IEEE.

* cited by examiner

*Primary Examiner* — Tan N Tran
(74) *Attorney, Agent, or Firm* — Brooks Acordia IP Law, PC

(57) ABSTRACT

A dynamic and end-user configurable controlled impedance interconnect line includes a plurality of conductive pixels, a plurality of thin-film transition material interconnects to electrically connect adjacent conductive pixels in the plurality of conductive pixels, and a plurality of addressable pixel interconnect actuators to selectively heat a respective plurality of the thin-film transition material interconnects. The plurality of addressable pixel interconnect actuators is operable to selectively heat a respective plurality of the thin-film transition material interconnects to form an interconnect line.

12 Claims, 4 Drawing Sheets

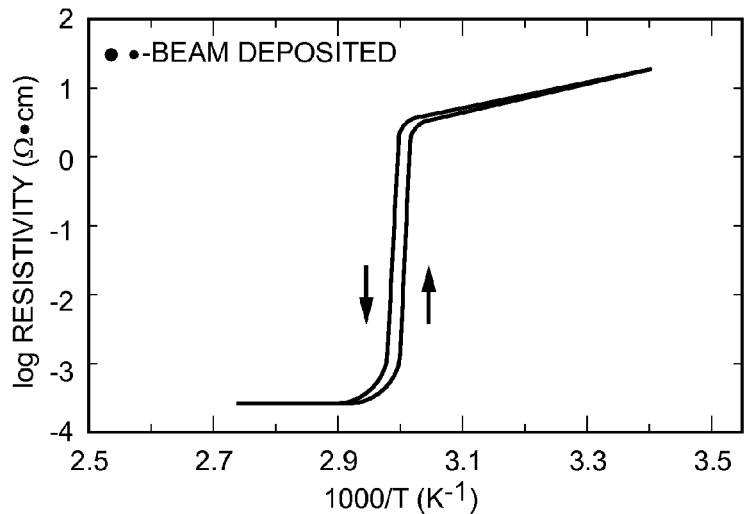
FIG. 3
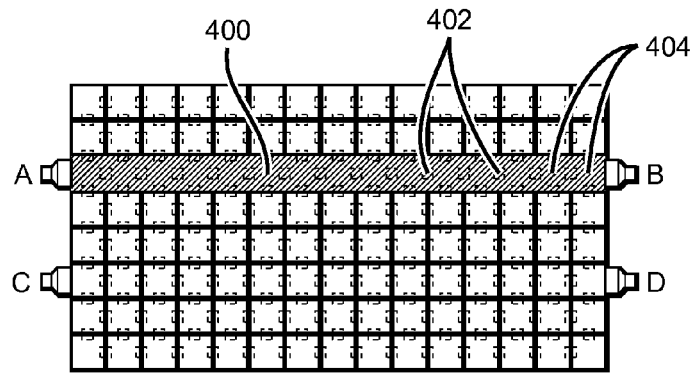
FIG. 4
FIG. 5
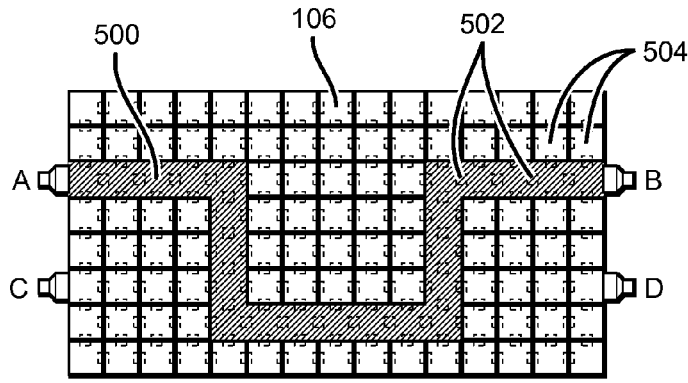

SYSTEM OF DYNAMIC AND END-USER CONFIGURABLE ELECTRICAL INTERCONNECTS

BACKGROUND OF THE INVENTION

1. Field of the Invention

This invention relates to integrated circuits, and more particularly to use of thin-film transition materials such as vanadium dioxide ($VO_2$) in integrated circuits.

2. Description of the Related Art

Many integrated circuits are designed and fabricated for a specific application. For example, monolithic microwave integrated circuits (MMICs) are useful to perform microwave mixing, switching and power amplification. Their physical configuration is fixed during the design process for manufacture. Unfortunately, systems utilizing MMICs may require MMICs tuned for different frequencies, necessitating switching between MMICs and/or incorporating additional complexity to address the system need. Similarly, integrated circuits are typically designed with fixed control line signal path options and fixed DC power paths.

A need exists to provide for dynamic and end-user configurable MMIC circuits, control line signal paths and DC power paths to reduce system complexity and cost.

SUMMARY OF THE INVENTION

A dynamic and end-user configurable controlled impedance interconnect line, in accordance with one embodiment, includes a plurality of conductive pixels, a plurality of thin-film transition material interconnects to electrically connect adjacent conductive pixels, and a plurality of addressable pixel interconnect actuators to selectively heat a respective plurality of the thin-film transition material interconnects. The plurality of addressable pixel interconnect actuators is operable to selectively heat a respective plurality of the thin-film transition material interconnects to form an interconnect line.

A method for establishing a dynamic and end-user configurable interconnect line is described that includes, in one embodiment, heating a first plurality of insulator-to-metal interconnects established between adjacent conductive pixels to form a first interconnect line between first and second terminals, removing heat from the first plurality of insulator-to-metal interconnects, and heating a second plurality of insulator-to-metal interconnects established between adjacent conductive pads to form a second interconnect line between the first and second terminals. The first and second interconnect lines are created by selectively heating respective pluralities of insulator-to-metal interconnects established between adjacent conductive pads.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIG. 3 is a graph illustrating the electrical properties of a $VO_2$ layer over a temperature range, in one embodiment of a thin-film transition material layer.

FIGS. 4, 5 and 6 are overhead plan views illustrating several possible transmission lines made in response to dynamic activation of thin-film heaters between a series of adjacent metallic pixels;

DETAILED DESCRIPTION OF THE INVENTION

A metallic pixel array is described that uses thermally switched insulator-to-metal transition material to create a dynamic and end-user configurable controlled impedance interconnect line to enable a field-programmable monolithic microwave integrated circuit (MMIC), dynamic control line signal paths and DC power paths.

Figure 1:
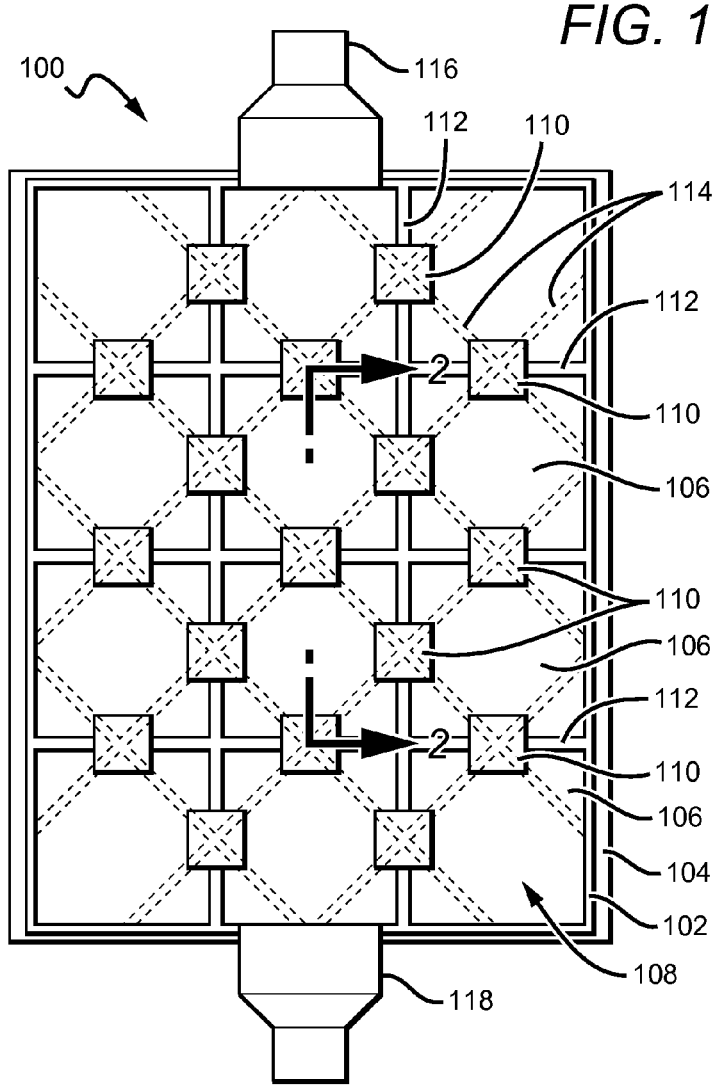
FIG. 1 is an overhead plan view of, in one embodiment, an end-user configurable controlled impedance transmission line.

FIG. 1 illustrates one embodiment a field-programmable pixel array for use as a dynamically reconfigurable interconnect line 100. A thin-film transition material layer (alternatively referred to as a insulator-to-metal layer), preferably an oxide of vanadium such as vanadium dioxide ($VO_2$) layer 102, is formed on a dielectric substrate such as a silicon substrate 104 such as by reactive ion beam sputtering for use at select locations as a thermal switch. Or, the substrate may be formed of Gallium Arsenide (GaAs), single-crystal sapphire or other dielectric substrate to provide support for the $VO_2$ layer 102. In an alternative embodiment, the transition material layer is formed of vanadium sesquioxide ($V_2O_3$) or other material that exhibits a change in resistivity as its temperature is varied over a narrow range near a known critical temperature.

Conductive pixels, preferably metallic pixels 106 formed of gold (Au), are spaced apart and formed on the $VO_2$ layer 102 using a lift-off process or other suitable method to form an array of metallic pixels 108. In one embodiment, each square pixel is preferably 5 microns on a side, although metallic pixels dimensions may be changed to fit a particular application, such as 1-10 microns on a side. For metallic pixels 106 having 5 microns on a side, such metallic pixels are spaced apart 1 micron, although other spacing may be used, such as 0.5 microns or 2 microns. The conductive pixels may also be formed of other non-metallic conductive materials or metals, such as Aluminum.

An interlayer dielectric (ILD) such as polyimide (see FIG. 2) is formed over the array of metallic pixels 106 to electrically isolate the conductive pixels 106 from pixel interconnect actuators that are preferably thin-film heaters 110 spaced above gaps 112 formed between adjacent pairs of metallic pixels 106. The thin-film heaters 110 are preferably nichrome that are respectively switchable to affect an insulator-to-metal transition in respective gaps 112 for establishing selective electrical communication between adjacent metallic pixels 106. Other pixel interconnect actuators may be used, such as Au micro-heaters or opto-thermal heaters such as imbedded LEDs. Also, in an alternative implementation, the ILD may be Benzocyclobutene (BCB) or other low dielectric constant (low k) material that is insulative and with the ability to withstand high temperatures.

Switch control wiring 114, illustrated as dashed lines, connect each thin-film heater to control switches (not shown) for addressable and selectable activation. Interconnect line terminals (116, 118) are coupled to respective metallic pixels on either end of the dynamically reconfigurable interconnect line 100. With the configuration illustrated in FIG. 1, reconfigurable interconnect line 100 may be used as a reconfigurable transmission line, reconfigurable dc power line or reconfigurable control line.

Figure 2:
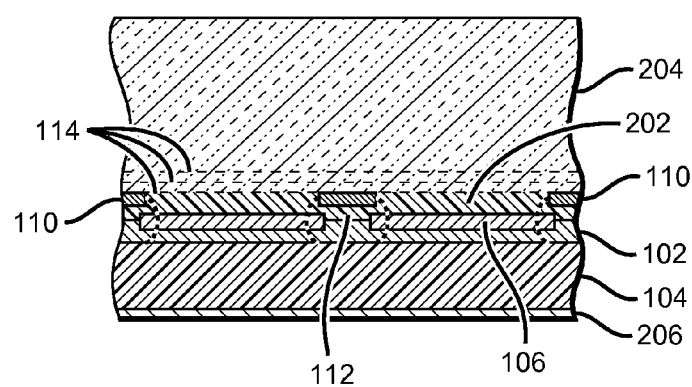
FIG. 2 is a cross section view of the embodiment of the invention shown in FIG. 1, along the line 2-2.

FIG. 2 is a cross section view of an embodiment shown in FIG. 1 along the line 2-2 and as used as a transmission line in a field programmable monolithic microwave integrated circuit (MMIC). Relative positions of the $VO_2$ layer 102, metallic pixels 106, and thin-film heaters 110 are illustrated, although the elements are not drawn to scale relative to each other and are shown generally to convey spatial and functional relationships. The metallic pixels 106 are seated on or in the $VO_2$ layer 102, with the $VO_2$ layer 102 formed on the silicon substrate 104. Each thin-film heater 110 is spaced apart from its respective metallic pixel pairs 106 by an ILD 202 to provide electric (but not thermal) insulation between them. A semiconductor substrate 204 is on the ILD and carries the switch control wiring 114 connected to respective thin-film heaters 110. The semiconductor substrate 204 is preferably formed from silicon, but may be formed from other materials such as GaAs, silicon germanium (SiGe), Gallium Nitride (GaN) or indium phosphide (InP). An electromagnetic ground plane 206 is on a side of the silicon substrate 104 opposite from that of the $VO_2$ layer. During operation, current is switched to a selected thin-film heater 110 or string of heaters and the resultant heat affects an insulator-to-metal transition in respective gaps 112 for establishing selective electrical communication between adjacent metallic pixels 106 and to establish a field-programmable MMIC. Although FIG. 2 illustrates one implementation of an interconnect for use as a transmission line in an MMIC, the interconnect disclosed hereunder has other applications. For example, a dynamically reconfigurable interconnect line may be used as an interconnect between resistors, capacitors, inductors, diodes and vias as well.

FIG. 3 is a graph illustrating the resistivity of the $VO_2$ layer 102 when heated by a pixel interconnect actuator such as a thin-film heater 110 (see FIGS. 1 and 2). The horizontal axis represents a normalized inverse of temperature (1000/T, where T is in Kelvin) such that temperature decreases in the positive direction (i.e., to the right of the origin). The vertical axis is the log of resistivity (log $\Omega$-cm). FIG. 3 shows that as temperature increases (moving from right to left along the hysteresis loop) the resistivity gradually decreases until a critical temperature is reached. At the critical temperature, the resistivity decreases by close to four orders of magnitude along the path indicated by the down arrow. As the temperature of the $VO_2$ layer 102 in each gap 112 between respective metallic pixel pairs 106 decreases, the resistivity goes up dramatically at a temperature that is slightly lower than the critical temperature. The hysteresis of the system results in a slightly slower recovery time in the reflective-to-insulating state transition than in the opposite transition.

Figure 6:
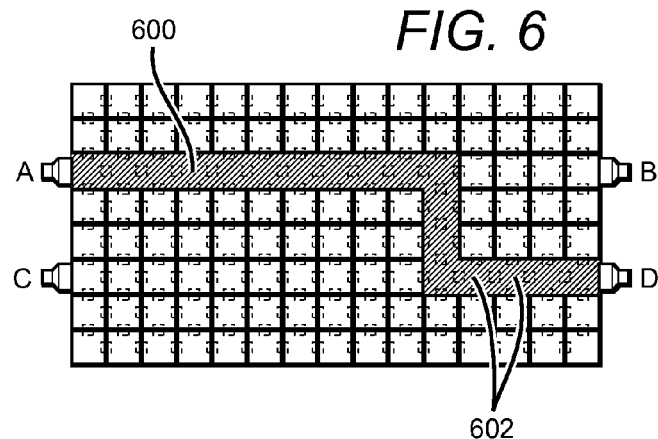

FIGS. 4, 5 and 6 illustrate several possible interconnect lines made in response to dynamic activation of thin-film heaters between a series of adjacent metallic pixels. In these figures, cross-hatching indicates a conductive path through a series of metallic pixel—$VO_2$ layer—metallic pixel groups.

In FIG. 4, interconnect 400 is created between terminals A and B through suitable switching of thin-film heaters 402 connecting adjacent metallic pixels 404 to establish a straight-line conduction path. In the illustrated array, each metallic pixel 404 is square and adjacent squares form linear rows and columns. In an alternative embodiment, each metallic pixel is a polygonal or other shape, such as a rectangle or triangle, which collectively may or may not form linear rows and columns. Also, although a single row of metallic pixels are activated to establish the conductor 400 between terminals A and B, a plurality of adjacent rows may be activated through suitable switching of thin-film heaters to affectively widen conduction path of the interconnect 400. Terminals C and D are illustrated without a conduction path.

In FIG. 5, an interconnect 500 is established between terminals A and B in a path that deviates from a straight line along a row of metallic pixels. Through suitable switching of thin-film heaters 502 between adjacent metallic pixels 504, a serpentine conduction path is created between terminals A and B to effectively increase the total conductive line length. In an alternative embodiment, the conductive line width may be increased by switching thin-film heaters in adjacent metallic pixels 504 to increase the conductive line width.

In FIG. 6, a conductor 600 is established between terminals A and D through suitable switching of thin-film heaters between adjacent metallic pixels 602 to form a line length that is approximately 18 metallic pixels long. In an alternative embodiment, different metallic pixels are switched to increase or decrease the total conduction path of the conductor 600. Or, different terminals may be connected by the conductor 600, such as terminals A-B, A-D, C-B, C-D, A-C or B-D. The conductor 600 may also connect more than one terminal, such as connecting A-B-C or B-D-A, through suitable switching of thin-film heaters between adjacent metallic pixels.

Although FIGS. 4, 5 and 6 illustrate interconnects having a width of one metallic pixel 106, in alternative embodiments, metallic pixels 106 may vary in length and width to increase or decrease the available resolution for generating interconnects between terminals. Also, the number and placement of thin-film heaters between adjacent metallic pixels may be modified to insure uniform and effective conduction between adjacent metallic pixels as the dimensions of the metallic pixels are changed for a specific application. For example, the use of larger metallic pixels may require the addition of one or more thin-film heaters between adjacent metallic pixels for effective conduction between them. Similarly, as metallic pixels dimensions are reduced, the number and size of required thin-film heaters may be suitably reduced as well. Also, arrays illustrated in FIGS. 4-6 each have an array of 120 metallic pixels, with the terminals located on opposing sides of the arrays. In other embodiments, the terminals are located on adjacent rather than opposite sides of the array or each terminal may be located on one side of the array, with the array merely providing "real estate" for establishing interconnects having predetermined lengths and widths.

Figure 7:
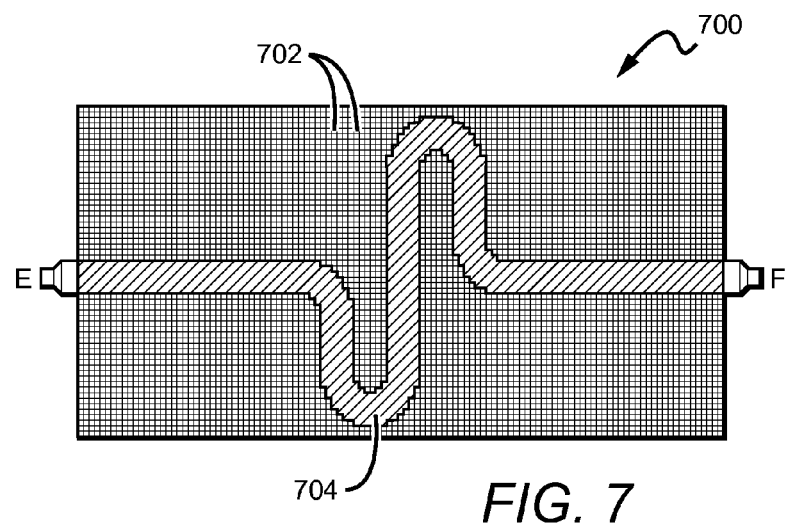
FIGS. 7 and 8 are overhead plan views showing, in one embodiment, metallic pixel arrays having sufficient metallic pixel pairs to accomplish a generally smooth and curved transmission line.
Figure 8:
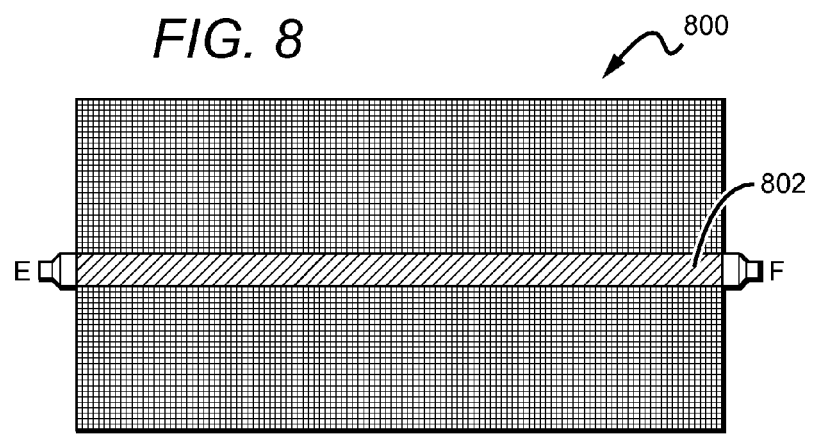

FIGS. 7 and 8 each illustrate an array of metallic pixels (700, 800) that have an interconnect with a line width greater than one metallic pixel. As the number of discrete metallic pixels 702 is increased in a given array dimension size, the ability of a designer to configure smooth-edged conductor lines is increased. FIG. 7 illustrates a serpentine interconnect 704 between terminals E and F that has a relatively smooth line perimeter in comparison to the conductors illustrated in FIGS. 4-6. Through the use of switchable thin-film heaters, the multi-pixel width interconnect 704 may be dynamically reconfigurable to a straight line interconnect 802 having the same line width and a shorter line path.

In each of FIGS. 4-8, the thin-film transition material interconnects connect a plurality of adjacent conductive pixels in a contiguous manner to form a dynamically reconfigurable interconnect line between terminals of interest. In other embodiments, such thin-film transition material interconnects are used to form non-contiguous line portions (not shown) adjacent to one or more interconnect lines. The non-contiguous line portions may be weakly coupled in an RF circuit through an inductive or capacitive coupling.

Figure 9:
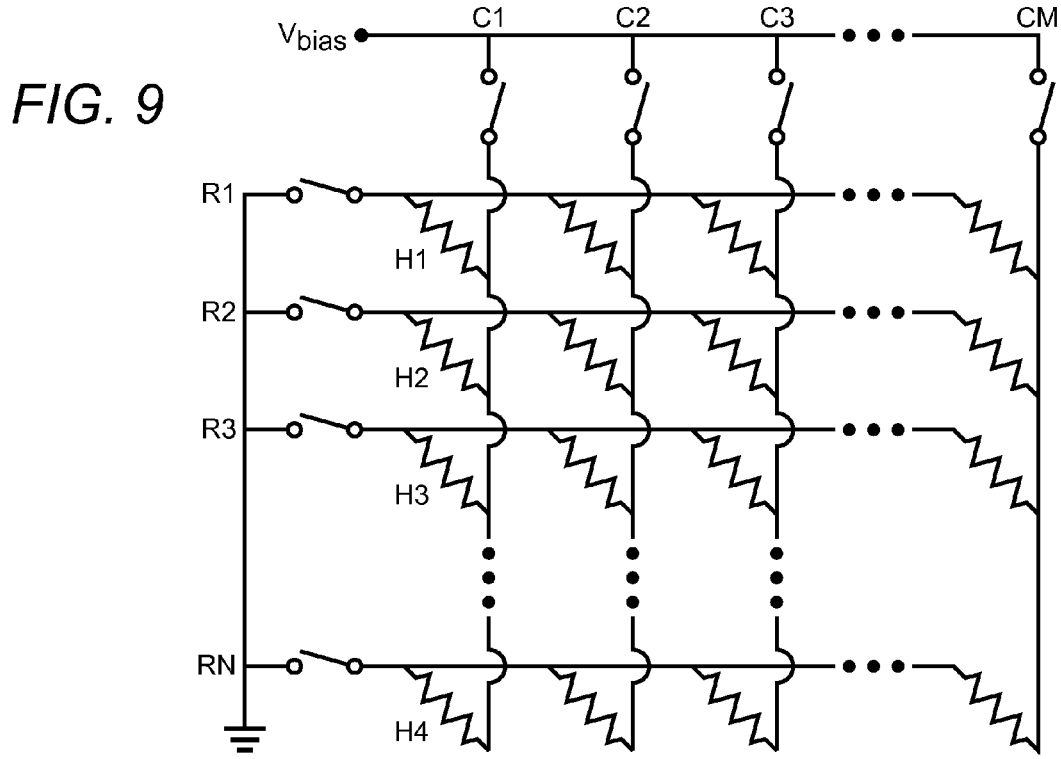
FIG. 9 is a schematic diagram illustrating one embodiment of a switching scheme for selective control of pixel interconnect actuators.
Figure 10:
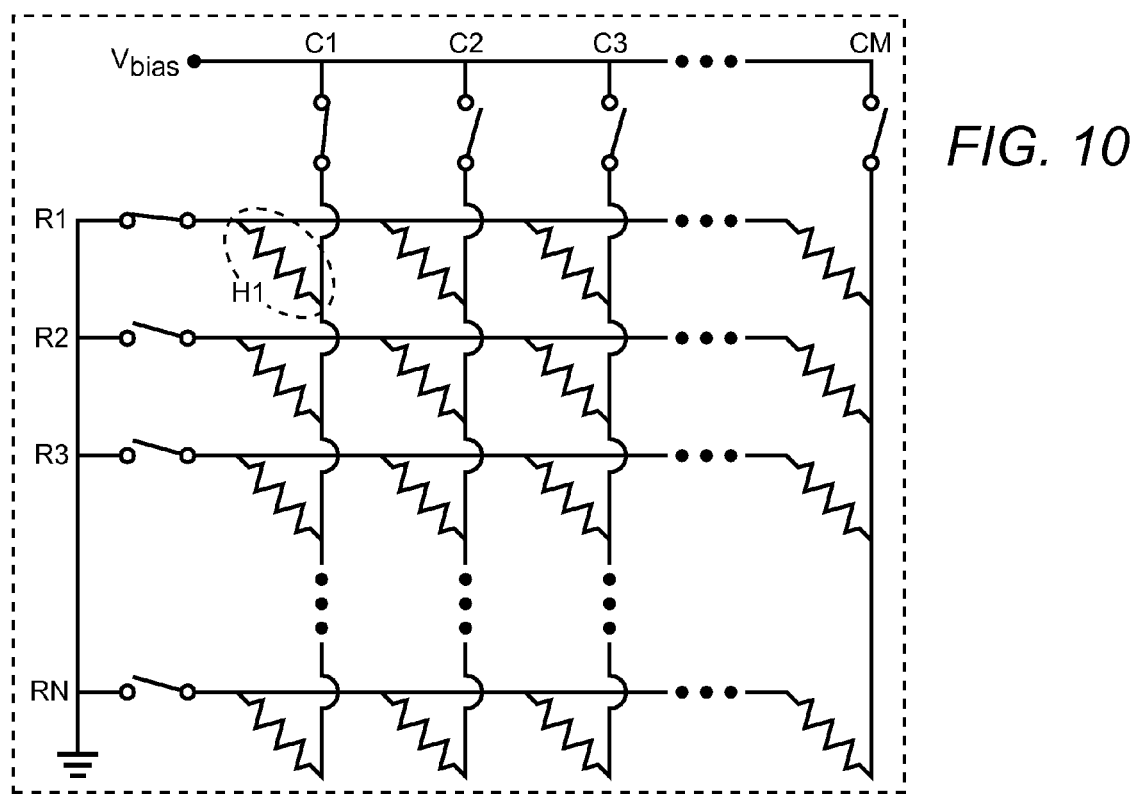
FIG. 10 is a schematic diagram illustrating the switching scheme of FIG. 8 and with one pixel interconnect actuated.

FIG. 9 illustrates one embodiment of a switching scheme for selective control of pixel interconnect actuators, such as thin-film resistors. In this embodiment, each switch in a linear array of switches (C1, C2, C3 . . . CM) is connected to each switch in a second linear array of switches (R1, R2, R3 . . . RN) through respective heater elements (H1, H2, H3 . . . HN). In a preferred embodiment, each heater element is positioned between a respective pair of metallic pixels (not shown) to enable a dynamic and end-user reconfigurable controlled impedance interconnect line. For example, in FIG. 10 switches C1 and R1 are closed to activate heater H1. Through suitable positioning of the heater H1 between adjacent metallic pixels, an interconnect is created as defined by the adjacent metallic pixels and heated thin-film transition material layer electrically connecting them.

We claim:

1. An electrical interconnect apparatus, comprising:
   a plurality of conductive pixels;
   a plurality of thin-film transition material interconnects to electrically connect adjacent conductive pixels in said plurality of conductive pixels; and
   a plurality of addressable pixel interconnect actuators to selectively heat a respective plurality of said thin-film transition material interconnects;
   wherein said plurality of addressable pixel interconnect actuators is operable to selectively heat a respective plurality of said thin-film transition material interconnects to form a
   dynamically reconfigurable interconnect line.

2. The apparatus of claim 1, wherein said plurality of thin-film transition material interconnects comprise a vanadium dioxide (VO2) layer on which said conductive pixels are seated.

3. The apparatus of claim 2, wherein said plurality of addressable pixel interconnect actuators comprise thin-film heaters.

4. The apparatus of claim 1, further comprising:
   a plurality of switches in communication with respective ones of said plurality of addressable pixel interconnect actuators to enable selective actuation of said plurality of thin-film transition material interconnects to form said interconnect line.

5. The apparatus of claim 1, further comprising:
   a substrate to seat said plurality of thin-film transition material interconnects.

6. The apparatus of claim 5, further comprising:
   a metallic ground plane on a side of said substrate opposite from said plurality of thin-film transition material interconnects to form an electromagnetic ground plane.

7. The apparatus of claim 1, wherein said conductive pixels comprise metallic pixels.

8. The apparatus of claim 7, wherein said plurality of addressable pixel interconnect actuators are operable to establish a straight interconnect line.

9. The apparatus of claim 7, wherein said plurality of addressable pixel interconnect actuators are operable to establish a serpentine interconnect line.

10. The apparatus of claim 9, wherein said serpentine interconnect line has a width of more than one conductive pixel.

11. The apparatus of claim 9, wherein said plurality of thin-film transition material interconnects comprise a plurality of insulator-to-metal interconnects.

12. The apparatus of claim 1, wherein said plurality of addressable pixel interconnect
    actuators is selected from the group consisting of thin-film heaters, Au micro-heaters and optothermal heaters.

* * * * *